US008599985B2

(12) United States Patent
Ahmed

(10) Patent No.: US 8,599,985 B2
(45) Date of Patent: Dec. 3, 2013

(54) SYSTEM AND METHOD FOR REDUCING LOCK ACQUISITION TIME OF A PHASE-LOCKED LOOP

(75) Inventor: Rizwan Ahmed, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 157 days.

(21) Appl. No.: 13/080,196

(22) Filed: Apr. 5, 2011

(65) Prior Publication Data

US 2012/0257701 A1 Oct. 11, 2012

(51) Int. Cl.
H03L 7/08 (2006.01)

(52) U.S. Cl.
USPC ............ 375/374; 375/371; 375/373; 375/376

(58) Field of Classification Search
USPC .......... 375/374, 376, 373, 371, 354; 327/157; 370/504
See application file for complete search history.

(56) References Cited

U.S. PATENT DOCUMENTS

| 5,448,598 | A  | * | 9/1995  | Yousefi et al. | 375/376 |
|-----------|----|---|---------|----------------|---------|
| 6,240,152 | B1 | * | 5/2001  | Ho             | 375/376 |
| 6,646,512 | B2 |   | 11/2003 | Abassi et al.  | 331/17  |
| 6,940,356 | B2 |   | 9/2005  | McDonald, II et al. | 331/16 |
| 7,151,413 | B2 | * | 12/2006 | Lin            | 331/11  |
| 7,746,181 | B1 | * | 6/2010  | Moyal          | 331/44  |
| 2004/0196107 | A1 | * | 10/2004 | Sogawa et al. | 331/16 |
| 2004/0251970 | A1 | * | 12/2004 | Fayneh et al. | 331/16 |
| 2007/0126514 | A1 | * | 6/2007  | Lin et al.    | 331/16 |
| 2008/0101521 | A1 | * | 5/2008  | Lee et al.    | 375/371 |
| 2009/0289725 | A1 |   | 11/2009 | Fu            | 331/17 |
| 2010/0289591 | A1 | * | 11/2010 | Garcia        | 331/108 R |

* cited by examiner

Primary Examiner — Shuwang Liu
Assistant Examiner — Helene Tayong
(74) Attorney, Agent, or Firm — Baker Botts L.L.P.

(57) ABSTRACT

In accordance with an embodiment of the present disclosure a phase-locked loop comprises a voltage controlled oscillator (VCO) configured to generate an output signal based on an input reference signal. The phase-locked loop further comprises a first charge pump communicatively coupled to a control input of the VCO and configured to generate, for a duration of time following occurrence of an event, a first control signal. The first control signal is independent of the output signal and is for causing the output signal to have a first frequency based on a second frequency of the input reference signal. The phase-locked loop further comprises a second charge pump communicatively coupled to the control input of the VCO. The second charge pump is configured to generate, after the duration of time, a second control signal. The second control signal is adjusted to lock the output signal with the input reference signal according to a phase difference between the output signal and the input reference signal such that the output signal is synchronized with the input reference signal.

24 Claims, 4 Drawing Sheets

US 8,599,985 B2

SYSTEM AND METHOD FOR REDUCING LOCK ACQUISITION TIME OF A PHASE-LOCKED LOOP

TECHNICAL FIELD

The present disclosure relates generally to oscillators, including, without limitation, lock acquisition of phase-locked loops of oscillators used in wireless communication devices.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. A receiver is an electronic device which receives and processes a wireless electromagnetic signal. A transmitter and receiver may be combined into a single device called a transceiver.

Transmitters, receivers, and transceivers often include components known as oscillators. An oscillator may serve many functions in a transmitter, receiver, and/or transceiver, including generating a local oscillator signal (usually in a radio-frequency range) for upconverting baseband signals onto a radio-frequency (RF) carrier and performing modulation for transmission of signals, and/or for downconverting RF signals to baseband signals and performing demodulation of received signals. Such oscillators may include components known as phase-locked loops (PLLs). A PLL may be a control system configured to generate an output signal whose phase is related to the phase of the input "reference" signal. A phase-locked loop circuit may compare the phase of the input signal with a phase signal derived from its output oscillator signal and may adjust the frequency of its oscillator to keep the phases matched. When the phases are matched, the PLL may be referred to as lock acquisition.

Upon power up, or transition out of standby or sleep mode of a transmitter, receiver and/or transceiver, the PLL may experience a delay between when the output signal of the PLL is matched with the input signal of the PLL. This delay before matching may be referred to as a lock acquisition time. In conventional PLL configurations this lock acquisition time may be in the tens of milliseconds which may cause a delay in when the oscillator may become operational.

SUMMARY

In accordance with some embodiments of the present disclosure, disadvantages associated with slow lock acquisition time of a phase-locked loop of an oscillator may be reduced or eliminated. In accordance with an embodiment of the present disclosure a phase-locked loop comprises a voltage controlled oscillator (VCO) configured to generate an output signal based on an input reference signal. The phase-locked loop further comprises a first charge pump communicatively coupled to a control input of the VCO and configured to generate, for a duration of time following occurrence of an event, a first control signal. The first control signal is independent of the output signal and is for causing the output signal to have a first frequency based on a second frequency of the input reference signal. The phase-locked loop further comprises a second charge pump communicatively coupled to the control input of the VCO. The second charge pump is configured to generate, after the duration of time, a second control signal. The second control signal is adjusted to lock the output signal with the input reference signal according to a phase difference between the output signal and the input reference signal such that the output signal is synchronized with the input reference signal.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
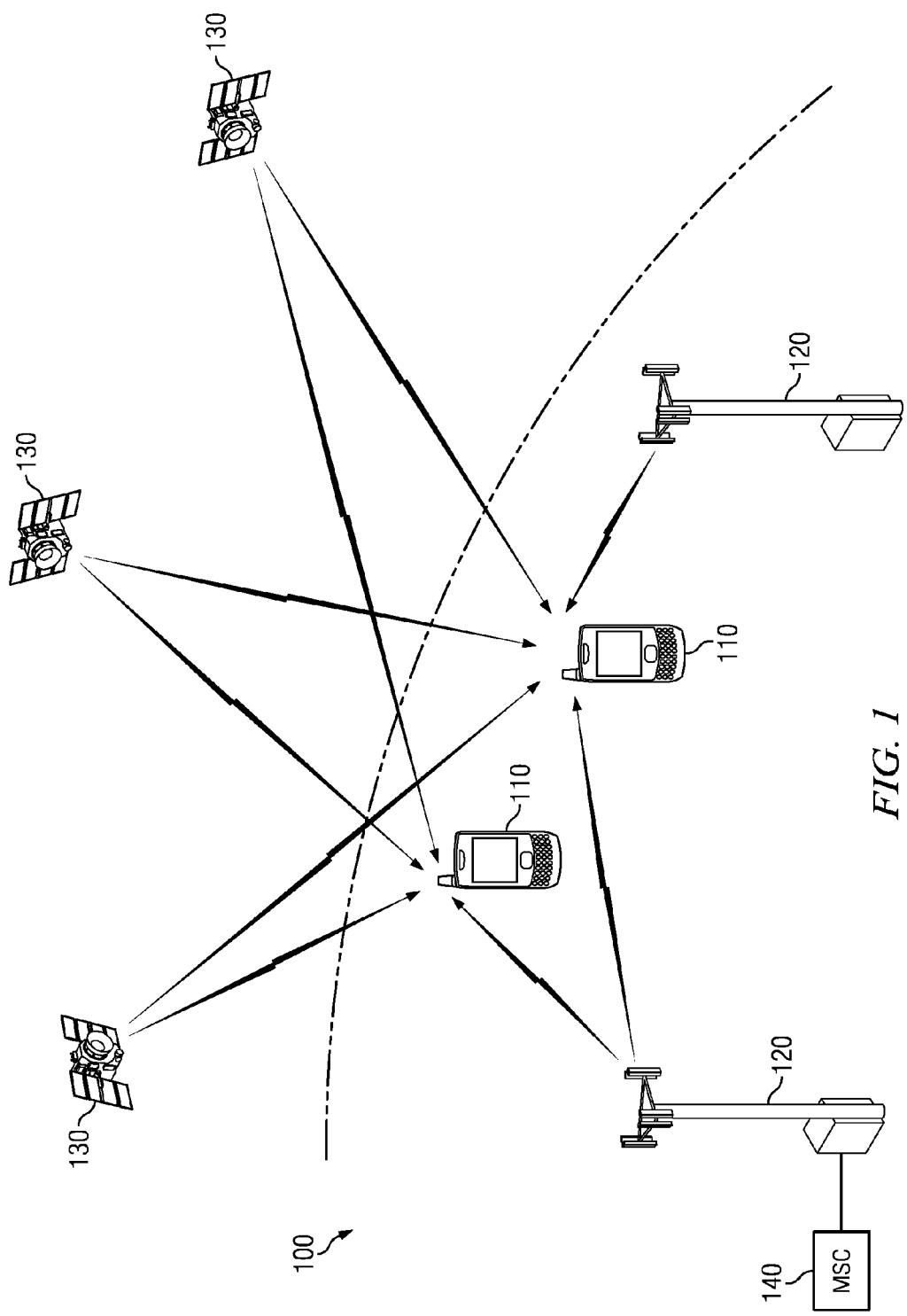
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
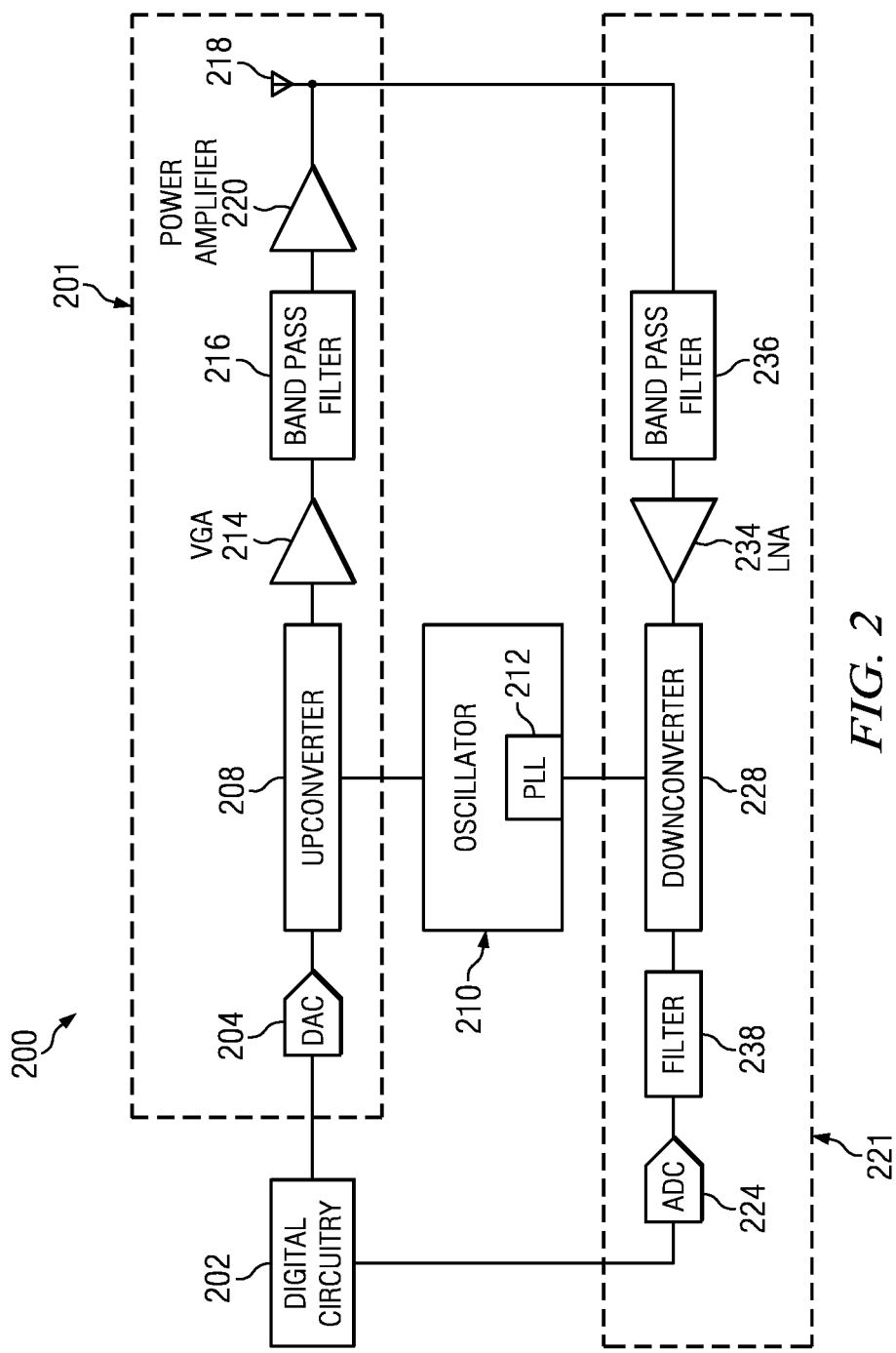
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

As shown in FIG. 2, oscillator may include a phase-locked loop (PLL) 212. PLL 212 may be a control system configured to generate a signal that has a fixed relation to the phase of a "reference" input signal by responding to both the frequency and the phase of the input signal, and automatically raising or lowering the frequency of a controlled oscillator until it is matched to the reference in both frequency and phase. PLL 212 may include a lock acquisition aid circuit configured to reduce the lock acquisition time of PLL 212, without affecting the loop bandwidth of PLL 212 as described in greater detail below with reference to FIG. 3. By reducing the lock acquisition time of PLL 212, PLL 212 may become operational more quickly than traditional PLL's. Additionally, by decreasing the lock acquisition time of PLL 212, PLL 212 may be turned on and off intermittently to reduce power consumption of element 200, which may prolong the battery life of a battery associated with element 200.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3:
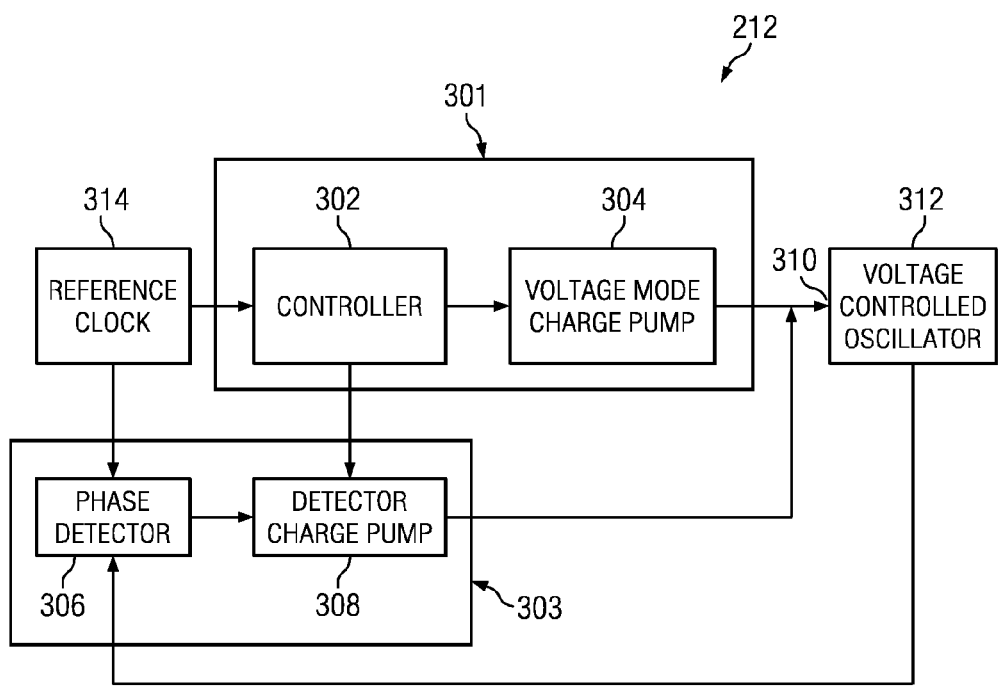
FIG. 3 illustrates a block diagram of a phase-locked loop (PLL) including a lock acquisition aid circuit, in accordance with certain embodiments of the present disclosure.

FIG. 3 illustrates a block diagram of PLL 212, in accordance with certain embodiments of the present disclosure. PLL 212 may include a lock acquisition aid circuit 301 configured to reduce the lock acquisition time of PLL 212, as described in further detail below. As depicted in FIG. 3, PLL 212 may additionally comprise a reference clock 314, a phase detector 306, a detector charge pump 308, and a voltage-controlled oscillator (VCO) 312.

VCO 312 may comprise any suitable component configured to generate an output signal having a particular frequency. VCO 312 may also be configured to vary the frequency of its output signal according to a control voltage received at a control input 310 of VCO 312. As discussed in further detail below, PLL 212 may be configured to adjust the output of VCO 312, such that the frequency and phase of the output signal of VCO 312 approximately matches the frequency and phase of a reference signal. In the present example, the frequency and phase of the reference signal may be associated with reference clock 314. For example, the reference signal may comprise reference clock 314 and may have a frequency and phase of reference clock 314. In alternative embodiments, the reference signal may have a frequency and phase that are multiples or fractions of reference clock 314. In the present disclosure the fraction or multiple may refer to any number less than or equal to one or greater than or equal to one.

Reference clock 314 may be communicatively coupled to phase detector 306 such that phase detector 306 receives reference clock 314. Reference clock 314 may be configured to have a frequency and phase associated with the desired frequency and phase of the output signal of VCO 312. Phase detector 306 may be configured to compare the phase of reference clock 314 to the phase of the output of VCO 312 to determine if a phase difference between the output signal of VCO 312 and reference clock 314 is present. Phase detector 306 may be configured to produce a signal indicating the phase difference. It is understood that a difference in the frequencies of the output signal of VCO 312 and reference clock 314 may also cause a difference in phase between the two signals. Accordingly, a phase difference detected by phase detector 306 may indicate a difference in the phase and/or frequency between the output signal of VCO 312 and reference clock 314. Phase detector 306 may be configured to communicate that signal to detector charge pump 308.

Detector charge pump 308 may comprise any suitable, system apparatus or device configured to generate an adjustable control voltage for VCO 312. In the present embodiment, detector charge pump 308 may be communicatively coupled to phase detector 306 such that detector charge pump 308 receives from phase detector 306 the signal indicating the phase difference between the output signal of VCO 312 and reference clock 314. Detector charge pump 308 may also be communicatively coupled to control input 310 of VCO 312 such that detector charge pump 308 may adjust the control voltage of VCO 312. Detector charge pump 308 may be configured to adjust the control voltage of VCO 312 at control input 310, according to the signal received from phase detector 306.

For example, phase detector 306 may detect a difference in the phase of the output signal of VCO 312 and reference clock 314 indicating that the output signal frequency is slower than the frequency of reference clock 314. Accordingly, phase detector 306 may direct detector charge pump 308 to increase the control voltage of VCO 312 to increase the frequency of the output signal of VCO 312. Conversely, in instances where the output signal frequency is faster than the frequency of reference clock 314, phase detector 306 may direct detector charge pump 308 to reduce the control voltage such that the output frequency is reduced. Phase detector 306 and charge pump 308 may repeat this process until the frequency and phase of the output signal of VCO 312 matches with the frequency and phase of reference clock 314 to achieve "lock acquisition." Therefore, phase detector 306 and detector charge pump 308 may be referred to as a phase locking circuit 303.

In some embodiments, upon initialization of PLL 212 (e.g., power up of element 200, or a transition out of standby or sleep mode of element 200), the initial voltage of detector charge pump 308 may be relatively small. Additionally, detector charge pump 308 may increase the control voltage at a relatively small rate of time. Therefore, the output signal of VCO 312 as controlled by detector charge pump 308 at initialization may have a relatively low frequency compared to the reference signal and detector charge pump 308 may be relatively slow at increasing the control voltage such that the output frequency of the output of VCO 312 may lock with the desired frequency associated with the reference signal.

Further, in some instances phase locking circuit 303 of PLL 212 may lose lock. Phase locking circuit 303 may lose lock in instances where noise above the system noise tolerance is introduced in the supply network of PLL 212. This noise may cause an instantaneous phase jump of phase detector 306, which may cause the output signal of VCO 312 to be out of phase with input reference clock 314. Additionally, at times reference clock 314 may have an almost instantaneous change in frequency, which may also cause PLL 212 to lose lock. Further, the change of a divider value of a divider (not expressly shown) in the feedback loop of PLL 212 may cause PLL 212 to lose lock. The divider value may change such that the output frequency of VCO 312 may be changed to be a multiple or fraction of the frequency of reference clock 314 such that the output frequency of VCO 312 may be changed according to the frequency demands of element 200.

Therefore, as discussed further below, PLL 212 may also include lock acquisition aid circuit 301 configured to provide a lock aid voltage value at control input 310 upon initialization to reduce or eliminate the frequency difference between the output of VCO 312 and the desired frequency associated with reference clock 314 to thus reduce the lock acquisition time achieved by detector charge pump 308. Further, as discussed in further detail below, lock acquisition aid circuit 301 may be configured to provide a control voltage to VCO 312 in other instances where phase locking circuit 303 (e.g., phase detector 306 and detector charge pump 308) loses lock.

Lock acquisition aid circuit 301 may be configured to disable phase locking circuit 303 (e.g., disable phase detector 306 and detector charge pump 308) and provide a lock aid voltage at control input 310 upon initialization of PLL 212. Lock acquisition aid circuit 301 may also be configured to disable phase locking circuit 303 and provide the lock aid control voltage in instances where phase locking circuit 303 loses lock of the output of VCO 312 with reference clock 314. The lock aid voltage may comprise a voltage that when applied at control input 310 of VCO 312, the frequency of the output signal of VCO 312 is approximately equal to a desired frequency associated with reference clock 314. As mentioned above, the desired output frequency of VCO 312 may be equal to the frequency of reference clock 314 and in other instances the desired output frequency may be a multiple or fraction of reference clock 314. Accordingly, the value of the lock aid voltage may be based on factors such as the frequency of reference clock 314, a divisor value associated with a multiple or fraction of reference clock 314 and/or the gain (megahertz/volts) of VCO 312.

In some instances, the frequency of reference clock 314 may change dramatically, or the divider value of a divider (not expressly shown) configured such that the output frequency of VCO 312 is associated with a multiple or fraction of the frequency of reference clock 314 may change. Accordingly, the desired output frequency of VCO 312 may dramatically change also. As mentioned above, in such instances, PLL 212 may lose lock and may attempt to reacquire lock based on the new frequency of reference clock 314 and/or the new frequency of the signal received at phase detector 306 from the divider. In such embodiments where this may occur, lock acquisition aid circuit 301 may be configured to provide a lock aid voltage as a function of a digital signal. In such instances where the changes occur, lock acquisition aid circuit 301 may be configured to provide a new lock aid voltage such that the output frequency of VCO 312 approximates the new desired output frequency of VCO 312 based on indications (e.g., instructions received from digital circuitry 202) that the frequency of reference clock 314 and/or the divider value have changed. Therefore, in some embodiments, the lock aid voltage may not be absolutely fixed, but may be quickly changed to provide a fixed voltage associated with each of one or more desired output frequencies of VCO 312.

Unlike the voltage provided by detector charge pump 308, the lock aid voltage provided by lock acquisition aid circuit 301 may be a voltage fixed for a particular desired output frequency associated with the frequency of reference clock 314 that is used to approximate the output frequency of VCO 312 with the desired frequency associated with reference clock 314. Additionally, the lock aid voltage may not be adjusted based on a feedback received from the output of VCO 312, unlike the voltage provided by detector charge pump 308 of phase lock circuit 303. Accordingly, the lock aid voltage may be independent of output signal generated by VCO 312. Therefore, the lock aid voltage may be used to approximate the output frequency of VCO 312 with a desired frequency associated with reference clock 314, but may not necessarily lock the output frequency of VCO 312 with the desired frequency associated with reference clock 314. Additionally, because lock acquisition aid circuit 301 may not be part of the feedback loop of PLL 212, lock acquisition aid circuit 301 may not change or affect various parameters (e.g., the loop bandwidth) of the feedback loop of PLL 212, such that elements of the feedback loop of PLL 212 (e.g., phase lock circuit 303) may be designed independently of lock acquisition aid circuit 301.

However, due to the fixed nature of the lock aid voltage for a particular desired output frequency and due to the lock aid voltage not being a function of feedback from VCO 312, the delays associated with feedbacks and adjusting the control voltage of VCO 312—such as those associated with detector charge pump 308 and phase detector 306—may be reduced or eliminated. Accordingly, at initialization or loss of lock, lock acquisition aid circuit 301 may quickly provide a fixed lock aid voltage to control input 310 of VCO 312 that may force VCO 312 to have an output signal with a frequency approximating the desired frequency associated with reference clock 314. Therefore, lock acquisition aid circuit 301 may enable the control voltage at control input 310 to move toward its desired value more quickly than if phase detector 306 and detector charge pump 308 were solely used to drive the control voltage immediately upon initialization or loss of lock.

After a determined period of time, lock acquisition aid circuit 301 may cease driving the control voltage and may enable detector charge pump 308, thus leaving detector charge pump 308 to drive the control voltage and lock the phase of VCO 312 with the desired phase associated with reference clock 314. With the control voltage of VCO 312 initially provided by lock acquisition aid circuit 301 such that the output frequency of VCO 312 approximates the frequency of reference clock 314, when the lock aid signal is disabled by lock acquisition aid circuit 301 and phase detector 306 and detector charge pump 308 are enabled, the difference in the phase of VCO 312 and reference clock 314 may be substantially smaller than without lock acquisition aid circuit 301. Accordingly, phase detector 306 and detector charge pump 308 may lock the frequency and phase of VCO 312 with the desired frequency and phase associated with reference clock 314 in a much shorter amount of time. The amount of time that lock acquisition aid circuit 301 is enabled combined with the lock time after lock acquisition aid circuit 301 is disabled may be less than the lock time of a PLL without lock acquisition aid circuit 301.

For example, the lock acquisition time from initialization until lock acquisition may be approximately less than 10 microseconds of a PLL 212 with a loop bandwidth of 2 megahertz (MHz) and with lock acquisition aid circuit 301. In contrast, the lock acquisition time of a conventional PLL with a loop bandwidth of 2 MHz without a lock acquisition aid circuit 301 may be around a millisecond. As another example, the lock acquisition time from initialization until lock acquisition may be approximately less than 100 microseconds of a PLL 212 with a loop bandwidth of 200 kilohertz (kHz) and with lock acquisition aid circuit 301. In contrast, the lock acquisition time of a conventional PLL with a loop bandwidth of 200 kHz without a lock acquisition aid circuit 301 may be tens of milliseconds. Therefore, lock acquisition aid circuit 301 may reduce the lock acquisition time of PLL 212 by approximately one hundred times or better over conventional PLL circuits.

The enable time of lock acquisition aid circuit 301 may vary depending on various characteristics and specifications of PLL 212. For example, the gain (megahertz/volt) of VCO 312, the loop bandwidth of PLL 212, the frequency of reference clock 314 and/or the divisor value of reference clock 314 (if applicable) may affect the determined enable time of lock acquisition aid circuit 301. Therefore, for a given reference frequency of reference clock 314 and gain of VCO 312, the enable time is inversely proportional to loop bandwidth of PLL 212, and may be adjusted by modifying loop filter parameters. Furthermore, for a given frequency of reference clock 314, the enable time is directly proportional to the gain of VCO 312.

Lock acquisition aid circuit 301 may include a controller 302 and a voltage mode charge pump 304 configured to perform one or more of the operations of lock acquisition aid circuit 301.

Voltage mode charge pump 304 may be communicatively coupled to control input 310 of VCO 312 and may comprise any suitable system, apparatus or device configured to provide the lock aid voltage to VCO 312. As mentioned above, the lock aid voltage may be determined such that the frequency of the output of VCO 312 approximates the desired frequency associated with reference clock 314. Additionally, as mentioned above, the lock aid voltage may be a fixed voltage associated with the desired output frequency of VCO 312 that is not adjusted according to a feedback from VCO 312, such that the lock aid voltage may be independent of the output signal of VCO 312, and may be reached in a relatively small amount of time. Therefore, when enabled, voltage mode charge pump 304 may be configured to quickly provide a fixed lock aid voltage to control input 310 of VCO 312 such that the output frequency of VCO 312 approximates the desired frequency associated with reference clock 314. Additionally, as described in further detail below, in some embodiments, voltage mode charge pump 304 may be configured to change the lock aid voltage according to a digital signal received from controller 302 such that voltage mode charge pump 304 may provide a lock aid voltage associated with each of one or more desired output frequencies of VCO 312 that may be associated with reference clock 314.

Unlike detector charge pump 308, voltage mode charge pump 304 may not be configured to adjust the lock aid voltage to lock the output of VCO 312 with reference clock 314, but may provide a quick initial voltage to control input 310 to approximate the output frequency of VCO 312 with the frequency of reference clock 314. Accordingly, when detector charge pump 308 is enabled, detector charge pump 308 and phase detector 306 may more quickly adjust the frequency and/or phase of the output of VCO 312 to lock the output of VCO 312 with reference clock 314. Voltage mode charge pump 304 may be communicatively coupled to controller 302 and may be enabled or disabled by controller 302, as discussed in further detail below.

As mentioned above, controller 302 may be configured to enable and disable voltage mode charge pump 304. Additionally, controller 302 may be configured to enable and disable phase detector 306 and detector charge pump 308. Accordingly, controller 302 may be communicatively coupled to voltage mode charge pump 304, phase detector 306 and detector charge pump 308. As discussed in further detail below, controller 302 may be configured to enable and disable voltage mode charge pump 304 and enable and disable detector charge pump 308 and phase detector 306 such that voltage mode charge pump 304 may aid lock acquisition of the output signal of VCO 312 with reference clock 314.

In some embodiments, controller 302 may be further configured to control the lock aid voltage of voltage mode charge pump 304 according to a digital signal such that voltage mode charge pump 304 may change the lock aid voltage. Controller 302 may direct a change in the lock aid voltage in instances where the frequency of reference clock 314 changes and/or a divider changes the divisor value associated with the output of VCO 312 and reference clock 314 such that the desired output frequency changes. Although, controller 302 and voltage mode charge pump 304 may be configured such that the lock aid voltage may be changed according to the desired output frequency of VCO 312, the lock aid voltage may be fixed for the desired output frequency associated with reference clock 314 and the lock aid voltage may not be adjusted based on the feedback. Therefore, controller 302 and voltage mode charge pump 304 may be configured to provide a lock aid voltage such that the output frequency of VCO 312 approximates each of one or more desired output frequencies of VCO 312 associated with reference clock 314 without affecting the feedback loop characteristics of PLL 212.

Controller 302 may comprise any suitable system, apparatus or device configured to perform the operations of controller 302. In some embodiments, controller 302 may comprise any system, device, or apparatus configured to interpret and/or execute program instructions and/or process data, and may include without limitation a microprocessor, microcontroller, digital signal processor (DSP), application specific integrated circuit (ASIC), or any other digital or analog circuitry configured to interpret and/or execute program instructions and/or process data. In some embodiments, controller 302 may interpret and/or execute program instructions and/or process data (e.g., voltage mode charge pump 304 control instructions) stored in memory communicatively coupled to controller 302 (not expressly shown).

Memory may comprise any system, device or apparatus operable to retain program instructions or data for a period of time (e.g., computer-readable media). Memory may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to controller 302 is turned off.

Upon initialization, controller 302 may be configured to communicate a signal to voltage mode charge pump 304. The signal may enable voltage mode charge pump 304 to provide a lock aid voltage to VCO 312 and thus force VCO 312 to output a signal having a frequency approximately equal to the desired frequency associated with reference clock 314. In some embodiments, while voltage mode charge pump 304 is enabled, controller 302 may also be configured to communicate a signal to detector charge pump 308 and phase detector 306 to disable detector charge pump 308 and phase detector 306 at initialization. Controller 302 may also be configured to communicate a control signal to voltage mode charge pump 304 to disable voltage mode charge pump 304 after a determined period of time.

As mentioned above, the amount of time that may pass between when voltage mode charge pump 304 is enabled and disabled may depend on various characteristics and specifications of PLL 212. As mentioned above, voltage mode charge pump 304 may be configured to provide a fixed initial voltage to control input 310 such that the frequency of the output of VCO 312 approximates the desired frequency associated with reference clock 314. However, the lock aid voltage provided by voltage mode charge pump 304 may be fixed for that particular desired output frequency associated with reference clock 314 and may not be a function of the feedback of VCO 312, such that the voltage mode charge pump 304 may not lock the frequency and phase of the output signal with the desired frequency and phase associated with reference clock 314. Therefore, upon disabling voltage mode charge pump 304, controller 302 may enable detector charge pump 308 and phase detector 306, which, as discussed previously, may be configured to adjust the control voltage at control input 310 of VCO 312 to lock the frequency and phase of the output signal of VCO 312 with the desired frequency and phase associated with reference clock 314. As mentioned previously, with the lock aid voltage driving the frequency of the output of VCO 312 to approximate the frequency of reference clock 314, when detector charge pump 308 and phase detector 306 are enabled and voltage mode charge pump 304 is disabled, detector charge pump 308 and phase detector 306 may achieve lock acquisition in a relatively fast amount of time.

In some embodiments, controller 302 may be communicatively coupled to reference clock 314 and may be configured to enable and/or disable voltage mode charge pump 304, phase detector 306 and/or detector charge pump 308 based on reference clock 314. For example, upon initialization and/or loss of lock, controller 302 may enable voltage mode charge pump 304, disable detector charge pump 308 and phase detector 306 and may also receive the reference signal from reference clock 314. Controller 302 may be configured to determine whether the determined amount of time for enabling voltage mode charge pump 304 and disabling phase detector 306 and detector charge pump 308 has passed according to reference clock 314.

For example, the enable time of voltage mode charge pump 304 may be associated with a particular number of cycles of the reference clock 314. Therefore, controller 302 may comprise a counter configured to count the number of cycles of reference clock 314. When the number of cycles associated with the enable time of voltage mode charge pump 304 have occurred since enabling voltage mode charge pump 304, controller 302 may be configured to disable voltage mode charge pump 304 and enable phase detector 306 and detector charge pump 308.

Accordingly, controller 302 may be configured to enable voltage mode charge pump 304 and disable detector charge pump 308 and phase detector 306 upon initialization such that voltage mode charge pump 304 may provide a lock aid voltage to VCO 312. The lock aid voltage may be a fixed voltage that may force the output frequency of VCO 312 to approximate the desired frequency associated with reference clock 314. Additionally, controller 302 may be configured to disable voltage mode charge pump 304 after a determined period of time and enable phase detector 306 and detector charge pump 308 to allow phase detector 306 and detector charge pump 308 to adjust the control voltage received at control input 310 to lock the output of VCO 312 with the reference signal associated with reference clock 314. When voltage mode charge pump 304 is disabled and detector charge pump 308 and phase detector 306 are enabled, with the frequency of the output signal of VCO 312 approximating the desired frequency associated with reference clock 314, the lock acquisition time of phase detector 306 and detector charge pump 308 may be significantly reduced. As such, controller 302 and voltage mode charge pump 304 of lock acquisition aid circuit 301 may be configured to reduce the lock acquisition time of phase detector 306 and detector charge pump 308 of PLL 212 (even taking into consideration the enable time of voltage mode charge pump 308 and the disable time of detector charge pump 308).

Modifications, additions or omissions may be made to element 200 without departing from the scope of the disclosure. For example, PLL 212 may include a loop filter coupled to control input 310 and configured to suppress high-frequency ripple and noise of control signals (e.g., control voltage) being inputted at control input 310. Additionally, in some embodiments, PLL 212 may include a divider coupled between the output of VCO 312 and the input of phase detector 306. In the same or alternative embodiments, a PLL 212 may include a divider coupled between reference clock 314 and phase detector 306. As mentioned above, the divider may be configured such that the frequency of the output of VCO 312 is a fraction or multiple of the frequency of reference clock 314. Further, the components of element 200 may be integrated or separated. Moreover, the operations of element 200 may be performed by more, fewer, or other components. Additionally, although the present description describes adjusting and manipulating voltages to adjust the output frequency of VCO 312, it is understood that currents may be adjusted or manipulated to achieve the same results.

Figure 4:
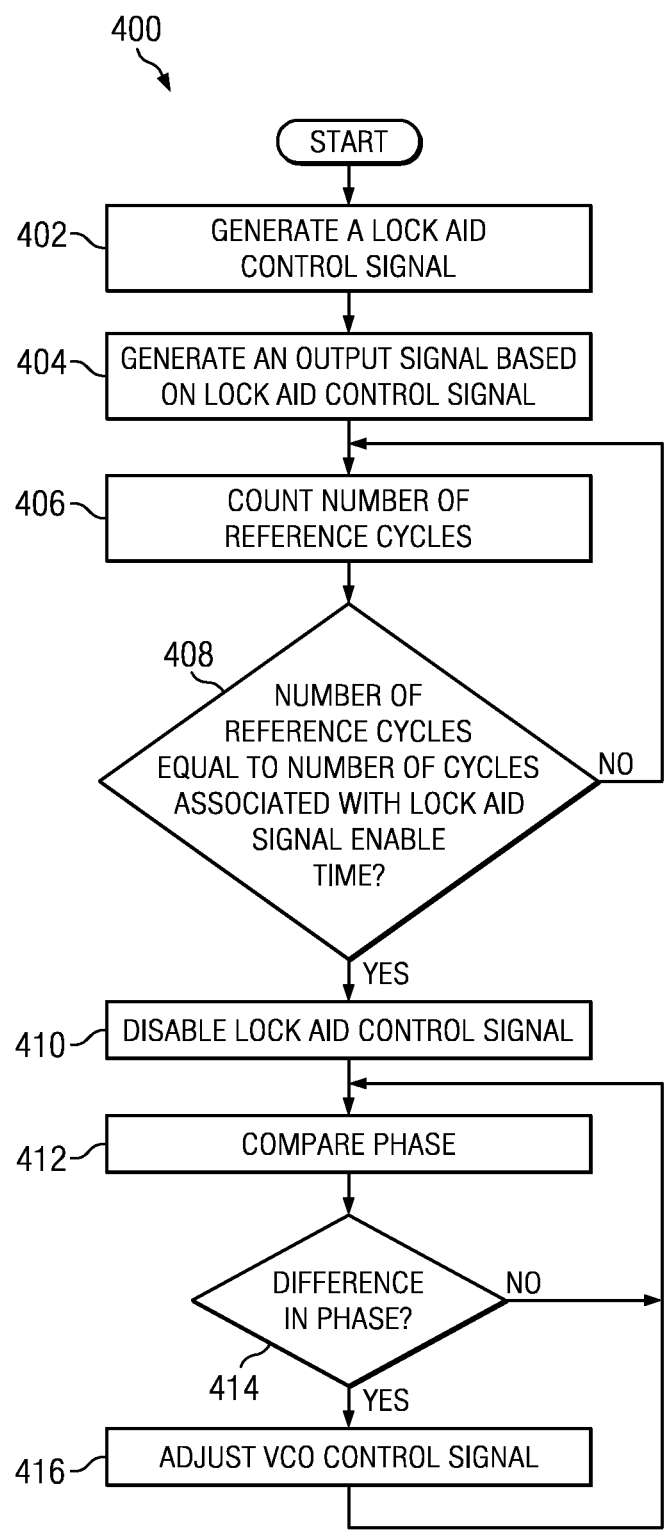
FIG. 4 illustrates an example method for reducing the lock acquisition time of a phase-locked loop, in accordance with certain embodiments of the present disclosure.

FIG. 4 illustrates an example method 400 for reducing the lock acquisition time of a phase-locked loop. Method 400 may be performed by any suitable, system, apparatus or device configured to perform one or more of the steps of method 400. In the present example method 400 may be performed by one or more components of a PLL such as PLL 212 described with respect to FIGS. 2 and 3, however any suitable components other than those specifically listed may perform the operations of PLL 212.

Method 400 may start and at step 402, a lock acquisition aid circuit of a PLL (e.g., lock acquisition aid circuit 301 of FIG. 3) may generate a lock aid signal for a voltage controlled oscillator (VCO) included in the PLL and configured to generate an output signal. The lock acquisition aid circuit of the PLL may also disable a phase detector and a detector charge pump (e.g., phase detector 306 and detector charge pump 308 of FIG. 3) of the PLL. The lock aid signal may be generated by a voltage mode charge pump such as voltage mode charge pump 304 of FIG. 3, for example. Additionally, the lock aid signal may be generated in response to a controller (e.g., controller 302 of FIG. 3) enabling the voltage mode charge pump.

The lock acquisition aid circuit may generate the lock aid signal and disable the detector charge pump and phase detector in response to initialization of the PLL (e.g., upon power up or transition from a sleep or standby mode of the element (e.g., transmitter, receiver, or transceiver) associated with the PLL). As mentioned above, the lock aid signal may be configured to provide an input control voltage for the VCO such that the frequency of the output signal of the VCO approximates a desired frequency associated with a reference signal (e.g., reference clock 314 of FIG. 3). At step 404, the VCO may generate an output signal having a frequency that approximates the desired frequency associated with the reference signal based on the lock aid signal.

At step 406, the lock acquisition aid circuit may count how many cycles of the reference signal have occurred since initialization and generation of the lock aid signal. At step 408 the lock acquisition aid circuit may determine if the number of cycles of the reference signal that have occurred is equal to the number of cycles associated with the lock aid signal enable time. As mentioned previously, the lock aid signal enable time may be based on how long the lock aid signal may force the output of the VCO. This time may be based on design specifications and characteristics of the PLL, as explained previously. Additionally, as discussed above, determination of whether the lock aid signal enable time has passed since the lock aid signal has been enabled may be made based on the number of cycles of the reference signal occurring since the lock aid signal has been enabled.

Accordingly at step 408, the lock acquisition aid circuit may determine if the number of reference signal cycles associated with the lock aid signal enable time have occurred since the lock aid signal was generated and enabled. If the number of reference signal cycles associated with the lock aid signal enable time has not occurred since the lock aid signal was generated and enabled, method 400 may return to step 406. Otherwise, method 400 may proceed to step 410.

At step 410, the lock acquisition aid circuit may disable the lock aid signal based on the lock aid signal enable time having passed. The lock acquisition aid circuit may also enable a phase detector and a detector charge pump (e.g., phase detector 306 and detector charge pump 308 of FIG. 3) based on the lock aid signal enable time having passed. For example, a controller of the lock acquisition aid circuit (e.g., controller 302 of FIG. 3) may disable a voltage mode charge pump of the lock acquisition aid circuit (e.g., voltage mode charge pump 304 of FIG. 3) configured to generate the lock aid signal, and may enable the phase detector and detector charge pump. Accordingly, at step 410, the control voltage of the VCO may be based according to a control voltage applied by a detector charge pump.

As mentioned earlier, the voltage of the voltage mode charge pump may be fixed for a desired output frequency such that the frequency of the output signal approximates the desired frequency associated wtih the reference signal, but is not necessarily locked with the frequency and phase of the reference signal. In contrast, the voltage of the detector charge pump may be varied according to the phase difference between the output signal of the VCO and the reference signal such that the frequencies and phases of the output signal and the reference signal may be locked by the detector charge pump. Accordingly, following step 410, method 400 may proceed to lock the frequency and phase of the output signal with the actual desired frequency and phase associated with the reference signal instead of just the approximation provided by the voltage mode charge pump.

At step 412, a phase detector of the PLL (e.g., phase detector 306 of FIG. 3) may compare the phase of the output signal with the phase of the reference signal, and at step 414 the phase detector may determine whether a difference in the phase of the output signal of the VCO and the desired phase associated with the reference signal exists. If a difference does not exist (indicating that the frequency and phase of the output signal and the reference signal match and are locked) method 400 may return to step 412 such that the PLL may continue monitoring for phase differences.

If a difference does exist at step 414, method 400 may proceed to step 416. At step 416, a detector charge pump of the PLL (e.g., detector charge pump 308 of FIG. 3) may adjust the VCO control signal based on the phase difference to adjust the phase of the output signal. Following step 416, method 400 may return to steps 412 and 414 where the phase detector of the PLL may determine whether the adjustment in the control voltage corrected the phase difference. If the control voltage adjustment does not correct the phase, as determined in step 414, steps 416, 412 and 414 may be repeated until lock acquisition is achieved. Once lock acquisition is achieved, method 400 may return to step 412 to continue monitoring for any phase differences such that lock acquisition may be maintained.

As mentioned above, due to the lock aid voltage forcing the input control voltage of VCO upon initialization, when the lock aid signal is disabled, the frequency of the output signal may approximate the desired frequency associated with the reference signal. Accordingly, the adjustment done in steps 412-416 to synchronize the frequencies and phases of the output signal and the desired frequency and phase associated with the reference signal may be relatively small, such that the lock acquisition time is reduced (even with the initial enable time taken into consideration).

Modifications, additions or omissions may be made to method 400 without departing from the scope of the present disclosure. For example, some of the described steps may be divided into more than one step, and in the same or alternative embodiments, some of the steps may be combined into a single step. Moreover, although the steps have been described in a particular order, it is understood that one or more steps may be performed in a different order or at the same time. Additionally, although specific components have been described as performing specific steps of method 400, it is understood that any suitable components configured to perform one or more steps of method 400 may be used.

Although the present disclosure has been described with several embodiments, various changes and modifications may be suggested to one skilled in the art. It is intended that the present disclosure encompass such changes and modifications as fall within the scope of the appended claims.

What is claimed is:

1. A phase-locked loop comprising:
    a voltage controlled oscillator (VCO) configured to generate an output signal based on an input reference signal;
    a first charge pump having an input independent from a feedback of the output signal of the VCO and an output communicatively coupled to a control input of the VCO and configured to generate, for a duration of time following occurrence of an event, a first control signal at the output of the first charge pump, the first control signal unaffected by the feedback of the output signal of the VCO, the first control signal for causing the output signal of the VCO to have a first frequency based on a second frequency of the input reference signal; and
    a second charge pump having an output communicatively coupled to the control input of the VCO and configured to generate, after the duration of time, a second control signal at the output of the second charge pump, the second control signal adjusted to lock the output signal of the VCO with the input reference signal according to a phase difference between the output signal of the VCO and the input reference signal such that the output signal of the VCO is synchronized with the input reference signal.

2. The phase-locked loop of claim 1, further comprising a controller communicatively coupled to the first charge pump and the second charge pump and configured to:
    enable the first charge pump and disable the second charge pump in response to occurrence of the event such that the output signal of the VCO is according to the first control signal upon occurrence of the event; and
    disable the first charge pump and enable the second charge pump in response to the duration of time passing since occurrence of the event such that the output signal of the VCO is based on the second control signal to obtain lock acquisition of the output signal with the input reference signal.

3. The phase-locked loop of claim 2, wherein the controller is further configured to:
    count a number of cycles of the reference signal occurring since occurrence of the event; and
    determine that the duration of time has passed according to the number of cycles of the reference signal.

4. The phase-locked loop of claim 1, wherein the duration of time is based on at least one of a gain of the VCO and a loop bandwidth of the phase-locked loop.

5. The phase-locked loop of claim 1, wherein the first charge pump is configured to generate the first control signal such that the first frequency is approximately equal to the second frequency.

6. The phase-locked loop of claim 1, wherein the first charge pump is configured to generate the first control signal such that the first frequency is approximately equal to a multiple of the second frequency.

7. The phase-locked loop of claim 1, wherein the event is associated with at least one of power up of a wireless communication element associated with the phase-locked loop, transition of the wireless communication element out of a sleep mode, transition of the wireless communication element out of a standby mode and lock of the output signal with the input reference signal being lost.

8. The phase-locked loop of claim 1, further comprising a phase detector communicatively coupled between the output of the VCO and the second charge pump and configured to:
    receive the output signal from the VCO;
    compare a first phase associated with the output signal to a second phase associated with the input reference signal;
    generate a phase detector signal indicative of the phase difference between the output signal and the input reference signal based on the comparison between the first phase and the second phase; and
    communicate the phase detector signal to the second charge pump such that the second charge pump generates the second control signal according to the phase detector signal.

9. A wireless communication element, comprising:
    a receive path configured to receive a first wireless communication signal and convert the first wireless communication signal into a first digital signal based at least on an oscillator signal; and
    a transmit path configured to convert a second digital signal into a second wireless communication signal based at least on the oscillator signal and transmit the second wireless communication signal; and
    an oscillator configured to output the oscillator signal to at least one of the receive path and the transmit path, the oscillator comprising a phase-locked loop configured to synchronize an output signal at its output to an input reference signal received at its input, the phase-locked loop comprising:
        a voltage controlled oscillator (VCO) configured to generate the output signal based on the input reference signal;
        a first charge pump having an input independent from a feedback of the output signal of the VCO and an output communicatively coupled to a control input of the VCO and configured to generate, for a duration of time following occurrence of an event, a first control signal at the output of the first charge pump, the first control signal unaffected by the feedback of the output signal of the VCO, the first control signal for causing the output signal of the VCO to have a first frequency based on a second frequency of the input reference signal; and
        a second charge pump having an output communicatively coupled to the control input of the VCO and configured to generate, after the duration of time, a second control signal at the output of the second charge pump, the second control signal adjusted to lock the output signal of the VCO with the input reference signal according to a phase difference between the output signal and the input reference signal such that the output signal of the VCO is synchronized with the input reference signal.

10. The wireless communication element of claim 9, wherein the phase-locked loop further comprises a controller communicatively coupled to the first charge pump and the second charge pump and configured to:
  enable the first charge pump and disable the second charge pump in response to occurrence of the event such that the output signal of the VCO is according to the first control signal upon occurrence of the event; and
  disable the first charge pump and enable the second charge pump in response to the duration of time passing since occurrence of the event such that the output signal of the VCO is based on the second control signal to obtain lock acquisition of the output signal with the input reference signal.

11. The wireless communication element of claim 10, wherein the controller is further configured to:
  count a number of cycles of the reference signal occurring since occurrence of the event; and
  determine that the duration of time has passed according to the number of cycles of the reference signal.

12. The wireless communication element of claim 9, wherein the duration of time is based on at least one of a gain of the VCO and a loop bandwidth of the phase-locked loop.

13. The wireless communication element of claim 9, wherein the first charge pump is configured to generate the first control signal such that the first frequency is approximately equal to the second frequency.

14. The wireless communication element of claim 9, wherein the first charge pump is configured to generate the first control signal such that the first frequency is approximately equal to a multiple of the second frequency.

15. The wireless communication element of claim 9, wherein the event is associated with at least one of power up of the wireless communication element, transition of the wireless communication element out of a sleep mode, transition of the wireless communication element out of a standby mode and lock of the output signal with the input reference signal being lost.

16. The wireless communication element of claim 9, further comprising a phase detector communicatively coupled between the output of the VCO and the second charge pump and configured to:
  receive the output signal from the VCO;
  compare a first phase associated with the output signal to a second phase associated with the input reference signal;
  generate a phase detector signal indicative of the phase difference between the output signal and the input reference signal based on the comparison between the first phase and the second phase; and
  communicate the phase detector signal to the second charge pump such that the second charge pump generates the second control signal according to the phase detector signal.

17. A method for reducing lock acquisition time of a phase-locked loop comprising:
  generating an output signal of a voltage controlled oscillator (VCO) associated with the phase-locked loop based on an input reference signal;
  generating a first control signal at a first node communicatively coupled to a control input of the VCO for a duration of time following occurrence of an event, the first control signal unaffected by a feedback of the output signal, the first control signal for causing the output signal to have a first frequency based on a second frequency of the input reference signal; and
  disabling a second control signal at a second node communicatively coupled to the control input of the VCO for the duration of time, the second control signal is adjustable to lock the output signal with the input reference signal according to a phase difference between the output signal and the input reference signal such that the output signal is synchronized with the input reference signal.

18. The method of claim 17, further comprising disabling the first charge pump and enabling the second charge pump in response to duration of time passing since occurrence of the event such that the output signal of the VCO is based on the second control signal to achieve lock acquisition of the output signal with the input reference signal.

19. The method of claim 18 further comprising:
  counting a number of cycles of the reference signal occurring since occurrence of the event; and
  determining that the duration of time has passed according to the number of cycles of the reference signal.

20. The method of claim 17, wherein the duration of time is based on at least one of a gain of the VCO and a loop bandwidth of the phase-locked loop.

21. The method of claim 17, wherein the event is associated with at least one of power up of a wireless communication element associated with the phase-locked loop, transition of the wireless communication element out of a sleep mode, transition of the wireless communication element out of a standby mode, and lock of the output signal with the reference input signal being lost.

22. The method of claim 17, further comprising generating the first control signal such that the first frequency is approximately equal to the second frequency.

23. The method of claim 17, further comprising generating the first control signal such that the first frequency is approximately equal to a multiple of the second frequency.

24. The method of claim 17, further comprising:
  receiving the output signal from the VCO;
  comparing a first phase associated with the output signal to a second phase associated with the input reference signal;
  generating a phase detector signal indicative of the phase difference between the output signal and the input reference signal based on the comparison between the first phase and the second phase; and
  generating the second control signal according to the phase detector signal.

* * * * *